United States Patent
Madigan et al.

(10) Patent No.: US 8,235,487 B2
(45) Date of Patent: Aug. 7, 2012

(54) RAPID INK-CHARGING OF A DRY INK DISCHARGE NOZZLE

(75) Inventors: Conor F. Madigan, San Francisco, CA (US); Eliyahu Vronsky, Los Altos, CA (US)

(73) Assignee: Kateeva, Inc., Menlo Park, CA (US)

( * ) Notice: Subject to any disclaimer, the term of this patent is extended or adjusted under 35 U.S.C. 154(b) by 321 days.

(21) Appl. No.: 12/652,046

(22) Filed: Jan. 5, 2010

(65) Prior Publication Data

US 2010/0171780 A1 Jul. 8, 2010

Related U.S. Application Data

(60) Provisional application No. 61/142,575, filed on Jan. 5, 2009.

(51) Int. Cl.
*B41J 29/38* (2006.01)
(52) U.S. Cl. ............... 347/9; 347/12; 347/56; 118/722
(58) Field of Classification Search .............. 347/2, 3, 347/4, 5, 9, 10; 118/722
See application file for complete search history.

(56) References Cited

U.S. PATENT DOCUMENTS

| | | | |
|---|---|---|---|
| 4,238,807 A | 12/1980 | Bovio et al. | |
| 4,751,531 A | 6/1988 | Saito et al. | |
| 5,041,161 A | 8/1991 | Cooke et al. | |
| 5,116,148 A | 5/1992 | Ohara et al. | |
| 5,155,502 A | 10/1992 | Kimura et al. | |

(Continued)

FOREIGN PATENT DOCUMENTS

EP 1 626 103 2/2006

(Continued)

OTHER PUBLICATIONS

PCT International Search Report and the Written Opinion of the International Searching Authority.

(Continued)

*Primary Examiner* — Lam S Nguyen
(74) *Attorney, Agent, or Firm* — Jeffery D. Frazier

(57) ABSTRACT

The present teachings relate to methods and apparatus for depositing one or more materials (e.g., one or more films, such as one or more solids) on one or more substrates, which may form part of an OLED or other type(s) of display. In some embodiments, the disclosure relates to apparatus and methods for depositing ink on one or more substrates. The apparatus can include, for example, one or more chambers for receiving ink, and plural orifices configured in the one or more chambers which are adapted for ejecting droplets of the ink; a discharge nozzle comprising an array of micro-pores (e.g., configured in a rectangular array), with each micro-pore having an inlet port and an outlet port, and the discharge nozzle receiving plural quantities (e.g., droplets) of ink from the chamber(s) via the orifices at the inlet ports and dispensing the ink from the outlet ports. The droplets of ink can be received at unique, spaced-apart locations on the inlet ports of the discharge nozzle. In some embodiments, a single liquid ink-holding chamber, which includes plural orifices (e.g., three), receives ink in liquid form having a plurality of suspended particles, and droplets of the ink are ejected substantially simultaneously from the chamber to respective, spaced-apart locations on the discharge nozzle; and the discharge nozzle evaporates the carrier liquid and deposits the solid particles on one or more substrates.

22 Claims, 7 Drawing Sheets

U.S. PATENT DOCUMENTS

| | | | |
|---|---|---|---|
| 5,172,139 A | 12/1992 | Sekiya et al. | |
| 5,202,659 A | 4/1993 | DeBonte et al. | |
| 5,247,190 A | 9/1993 | Friend et al. | |
| 5,405,710 A | 4/1995 | Dodobalapur et al. | |
| 5,574,485 A | 11/1996 | Anderson et al. | |
| 5,623,292 A | 4/1997 | Shrivastava | |
| 5,703,436 A | 12/1997 | Forrest et al. | |
| 5,707,745 A | 1/1998 | Forrest et al. | |
| 5,731,828 A | 3/1998 | Ishinaga et al. | |
| 5,781,210 A | 7/1998 | Hirano et al. | |
| 5,801,721 A | 9/1998 | Gandy et al. | |
| 5,834,893 A | 11/1998 | Bulovic et al. | |
| 5,844,363 A | 12/1998 | Gu et al. | |
| 5,865,860 A | 2/1999 | Delnick | |
| 5,947,022 A | 9/1999 | Freeman et al. | |
| 5,956,051 A | 9/1999 | Davies et al. | |
| 6,013,982 A | 1/2000 | Thompson et al. | |
| 6,065,825 A | 5/2000 | Anagnostopoulos et al. | |
| 6,086,195 A | 7/2000 | Bohorquez et al. | |
| 6,086,196 A | 7/2000 | Ando et al. | |
| 6,086,679 A | 7/2000 | Lee et al. | |
| 6,087,196 A | 7/2000 | Sturm et al. | |
| 6,091,195 A | 7/2000 | Forrest et al. | |
| 6,095,630 A | 8/2000 | Horii et al. | |
| 6,097,147 A | 8/2000 | Baldo et al. | |
| 6,189,989 B1 | 2/2001 | Hirabayashi et al. | |
| 6,250,747 B1 | 6/2001 | Hauck | |
| 6,257,706 B1 | 7/2001 | Ahn | |
| 6,294,398 B1 | 9/2001 | Kim et al. | |
| 6,303,238 B1 | 10/2001 | Thompson et al. | |
| 6,312,083 B1 | 11/2001 | Moore | |
| 6,326,224 B1 | 12/2001 | Xu et al. | |
| 6,337,102 B1 | 1/2002 | Forrest et al. | |
| 6,431,702 B2 | 8/2002 | Ruhe | |
| 6,444,400 B1 | 9/2002 | Cloots et al. | |
| 6,453,810 B1 | 9/2002 | Rossmeisl et al. | |
| 6,460,972 B1 | 10/2002 | Trauernicht et al. | |
| 6,468,819 B1 | 10/2002 | Kim et al. | |
| 6,472,962 B1 | 10/2002 | Guo et al. | |
| 6,498,802 B1 | 12/2002 | Chu et al. | |
| 6,513,903 B2 | 2/2003 | Sharma et al. | |
| 6,548,956 B2 | 4/2003 | Forrest et al. | |
| 6,562,405 B2 | 5/2003 | Eser et al. | |
| 6,576,134 B1 | 6/2003 | Agner | |
| 6,586,763 B2 | 7/2003 | Wang et al. | |
| 6,601,936 B2 | 8/2003 | McDonald | |
| 6,666,548 B1 | 12/2003 | Sadasivan et al. | |
| 6,811,896 B2 | 11/2004 | Aziz et al. | |
| 6,824,262 B2 | 11/2004 | Kubota et al. | |
| 6,861,800 B2 | 3/2005 | Tyan et al. | |
| 6,896,346 B2 | 5/2005 | Trauernicht et al. | |
| 6,911,671 B2 | 6/2005 | Marcus et al. | |
| 6,917,159 B2 | 7/2005 | Tyan et al. | |
| 6,982,005 B2 | 1/2006 | Eser et al. | |
| 7,023,013 B2 | 4/2006 | Ricks et al. | |
| 7,077,513 B2 | 7/2006 | Kimura et al. | |
| 7,247,394 B2 | 7/2007 | Hatwar et al. | |
| 7,374,984 B2 | 5/2008 | Hoffman | |
| 7,377,616 B2 | 5/2008 | Sakurai | |
| 7,404,862 B2 | 7/2008 | Shtein et al. | |
| 7,406,761 B2 | 8/2008 | Jafri et al. | |
| 7,410,240 B2 | 8/2008 | Kadomatsu et al. | |
| 7,431,435 B2 | 10/2008 | Lopez et al. | |
| 7,431,968 B1 | 10/2008 | Shtein et al. | |
| 7,530,778 B2 | 5/2009 | Yassour et al. | |
| 7,603,439 B2 | 10/2009 | Dilley et al. | |
| 7,604,439 B2 | 10/2009 | Yassour et al. | |
| 7,648,230 B2 | 1/2010 | Kachi | |
| 7,677,690 B2 | 3/2010 | Takatsuka | |
| 7,802,537 B2 | 9/2010 | Kang et al. | |
| 7,857,121 B2 | 12/2010 | Yassour | |
| 7,883,832 B2 | 2/2011 | Colburn et al. | |
| 7,908,885 B2 | 3/2011 | Devitt | |
| 8,128,753 B2 * | 3/2012 | Bulovic et al. | 118/722 |
| 2001/0045973 A1 | 11/2001 | Sharma et al. | |
| 2002/0008732 A1 | 1/2002 | Moon et al. | |
| 2002/0191063 A1 | 12/2002 | Gelbart et al. | |
| 2003/0230980 A1 | 12/2003 | Forrest et al. | |
| 2004/0009304 A1 | 1/2004 | Pichler et al. | |
| 2004/0048000 A1 | 3/2004 | Shtein et al. | |
| 2004/0048183 A1 | 3/2004 | Teshima | |
| 2004/0056244 A1 | 3/2004 | Marcus et al. | |
| 2004/0086631 A1 | 5/2004 | Han | |
| 2004/0202794 A1 | 10/2004 | Yoshida | |
| 2005/0190220 A1 | 9/2005 | Lim et al. | |
| 2005/0255249 A1 | 11/2005 | Schlatterbeck | |
| 2006/0012290 A1 | 1/2006 | Kang | |
| 2006/0115585 A1 | 6/2006 | Bulovic et al. | |
| 2007/0040877 A1 | 2/2007 | Kachi | |
| 2007/0058010 A1 | 3/2007 | Nagashima | |
| 2007/0098891 A1 | 5/2007 | Tyan et al. | |
| 2007/0134512 A1 | 6/2007 | Klubek et al. | |
| 2007/0286944 A1 | 12/2007 | Yokoyama et al. | |
| 2008/0174235 A1 | 7/2008 | Kim et al. | |
| 2008/0238310 A1 | 10/2008 | Forrest et al. | |
| 2008/0299311 A1 | 12/2008 | Shtein et al. | |
| 2008/0308037 A1 | 12/2008 | Bulovic et al. | |
| 2008/0311289 A1 | 12/2008 | Bulovic et al. | |
| 2008/0311296 A1 | 12/2008 | Shtein et al. | |
| 2008/0311307 A1 | 12/2008 | Bulovic et al. | |
| 2009/0031579 A1 | 2/2009 | Piatt et al. | |
| 2009/0045739 A1 | 2/2009 | Kho et al. | |
| 2009/0115706 A1 | 5/2009 | Hwang et al. | |
| 2009/0167162 A1 | 7/2009 | Liu et al. | |
| 2009/0220680 A1 | 9/2009 | Winters | |
| 2010/0055810 A1 | 3/2010 | Sung et al. | |
| 2010/0079513 A1 | 4/2010 | Taira et al. | |
| 2010/0171780 A1 | 7/2010 | Madigan et al. | |
| 2010/0188457 A1 | 7/2010 | Madigan et al. | |
| 2010/0201749 A1 | 8/2010 | Somekh et al. | |
| 2010/0310424 A1 | 12/2010 | Rose et al. | |
| 2011/0008541 A1 | 1/2011 | Madigan et al. | |
| 2011/0057171 A1 | 3/2011 | Adamovich et al. | |
| 2011/0181644 A1 * | 7/2011 | Bulovic et al. | 347/10 |
| 2011/0267390 A1 * | 11/2011 | Bulovic et al. | 347/9 |
| 2011/0293818 A1 | 12/2011 | Madigan et al. | |

FOREIGN PATENT DOCUMENTS

| | | |
|---|---|---|
| JP | 06-122201 | 5/1994 |
| JP | 08-216401 | 8/1996 |
| JP | 09-248918 | 9/1997 |
| JP | 2002-069650 | 3/2002 |
| JP | 2005-286069 | 10/2005 |
| JP | 2006-123551 | 5/2006 |
| JP | 2006-150900 | 6/2006 |
| JP | 2007-076168 | 3/2007 |
| JP | 2007-095343 | 4/2007 |
| JP | 2007-299616 | 11/2007 |
| JP | 05-255630 | 10/2009 |
| KR | 100232852 | 12/1999 |
| KR | 10-2008-0060111 | 7/2007 |
| WO | WO 2005/090085 | 9/2005 |

OTHER PUBLICATIONS

Street et al., "Jet Printing of Active-Matrix TFT Backplanes for Displays and Sensors", *IS&T Archiving*, Dec. 2005, vol. 20, No. 5, 16 pages.

Forrest, Stephen R., "The Path to Ubiquitous and Low-cost Organic Electronic Appliances on Plastic," *Nature*, Apr. 29, 2004, vol. 428, 8 pages.

Leblanc et al., "Micromachined Printheads for the Evaporative Patterning of Organic Materials and Metals," *Journal of Microelectromechanical Systems*, Apr. 2007, vol. 16, No. 2, 7 pp. 1-139.

Lindermann et al., "Thermal Bubble Jet Printhead with Integrated Nozzle Plate," *NIP20: International Conference on Digital Printing Technologies*, Oct. 2004, pp. 834-839.

Chen, Jianglong, "Novel Patterning Techniques for Manufacturing Organic and Nanostructured Electronics," *M.S. Materials Science and Engineering*, Massachusetts Institute of Technology, 2003, pp. 1-206.

Chen, Jingkuang et al., "A High-Resolution Silicon Monolithic Nozzle Array for Inkjet Printing," *IEEE Transactions on Electron Devices*, vol. 44, No. 9, Sep. 1997, pp. 1401-1409.

Chen et al., "Evaporative Deposition of Molecular Organics in Ambient with a Molecular Jet Printer," *Digital Fabrication*, Sep. 2006, pp. 63-65.

Chen et al., "Ambient Environment Patterning of Organic Thin Films by a Second Generation Molecular Jet (MoJet) Printer," *Progress Report* 2006-2007, Oct. 2007, pp. 26-6; 26-7.

International Search Report issued on Dec. 15, 2010 for PCT Application No. PCT/US10/020144.

International Search Report issued on Sep. 2, 2010 for PCT Application No. PCT/US10/033315.

International Search Report and Written Opinion issued on Mar. 24, 2011 for PCT Application No. PCT/US10/058145.

International Preliminary Report on Patentability issued on Dec. 17, 2009 for PCT Application No. PCT/US08/66975.

International Preliminary Report on Patentability issued on Dec. 7, 2009 for PCT Application No. PCT/US08/066991.

International Preliminary Report on Patentability issued on Dec. 17, 2009 for PCT Application No. PCT/US08/67002.

EP Examination Report dated Jul. 30, 2010 issued for EP Patent Application 08771068.7.

CN Office Action dated Oct. 12, 2010 issued for CN Patent Application 200880020197.8.

CN Second Office Action dated Jun. 22, 2011 issued for CN Patent Application 200880020197.8.

EP Examination Report dated Jul. 13, 2010 issued for EP Patent Application 08771094.3.

CN Office Action dated Dec. 17, 2010 issued for CN Patent Application 200880020151.6.

CN Office Action dated Jan. 12, 2011 issued for CN Patent Application 200880019990.6.

EP Examination Report dated Jul. 13, 2010 issued for EP Patent Application 08771084.4.

Chin, Byung Doo, "Effective Hole Transport Layer Structure for Top Emitting Devices Based on Laser Transfer Patterning," *Journal of Physics D: Applied Physics*, 2007, vol. 40, pp. 5541-5546.

Elwenspoek et al., "Silicon Micromachining," Aug. 2004, Cambridge University, Cambridge, U.K. ISBN 0521607671. [Abstract].

C. Ducso, et al. "Porous Silicon Bulk Micromachining for Thermally Isolated Membrane Formation," *Sensors and Actuators A*, 1997, vol. 60, pp. 235-239.

C. Tsamis, et al. "Thermal Properties of Suspended Porous Microhotplates for Sensor Applications," *Sensor and Actuators B*, 2003, vol. 95, pp. 78-82.

J. Lee, et al. "Differential Scanning Calorimeter Based on Suspended Membrane Single Crystal Silicon Microhotplate," *Journal of Microelectromechanical Systems*, Dec. 2008, vol. 17, No. 6, pp. 1513-1525.

J. C. Belmonte, et al. "High-temperature Low-power Performing Micromachined Suspended Micro-hotplate for Gas Sensing Applications<" *Sensors and Actuators B*, 2006, vol. 114, pp. 826-835.

G.S. Chung, "Fabrication and Characterization of Micro-heaters with Low-power Consumption using SOI membrane and Trench Structures," *Sensors and Actuators A*, 2004, vol. 112, pp. 55-60.

Geffroy et al., "Organic Light-emitting Diode (OLED) Technology: Material Devices and Display Technologies," *Polymer International*, Jun. 2006, vol. 55, pp. 572-582. (Abstract only).

Huang et al., "Reducing Blueshift of Viewing Angle for Top-Eimtting Organic Light-Emitting Devices," Dec. 6, 2008, 3 pages.

J. Lee, et al. "Cavity Effects on Light Extraction in Organic Light emitting Devices," *Applied Physics Letters*, Jan. 24, 2008, vol. 92, No. 3, 5 pages.

S.H. Kim et al. "Fabrication and Characterization of co-planar type MEMS Structures on SiO2/Si3N4 Membrane for Gas Sensors with Dispensing Method Guided by Micromachined Wells," Journal of Eletroceramics, Jun. 27, 2005, vol. 17, No. 2-4, pp. 995-998.

* cited by examiner

RAPID INK-CHARGING OF A DRY INK DISCHARGE NOZZLE

CROSS-REFERENCE TO RELATED APPLICATIONS

This application claims a priority benefit under 35 U.S.C. §119(e) from U.S. Provisional Patent Application. No. 61/142,575, filed Jan. 5, 2009, which is incorporated herein by reference in its entirety.

FIELD

The present teachings relate to methods and apparatus for depositing one or more materials (e.g., one or more films, such as one or more solids) on one or more substrates. More specifically, aspects of the present teachings relate to methods and apparatus for depositing one or more films, which can comprise one or more solids, on one or more substrates, which can form part of an LED or other type(s) of display.

INTRODUCTION

The manufacture of organic light emitting devices (OLEDs) requires depositing one or more organic films on a substrate and coupling the top and bottom of the film stack to electrodes. The film thickness is a prime consideration. The total layer stack thickness is about 100 nm and each layer is optimally deposited uniformly with an accuracy of better than ±1 nm. Film purity is also important. Conventional apparatus form the film stack using one of two methods: (1) thermal evaporation of organic material in a relative vacuum environment and subsequent condensation of the organic vapor on the substrate; or, (2) dissolution of organic material into a solvent, coating the substrate with the resulting solution, and subsequent removal of the solvent.

Another consideration in depositing the organic thin films of an OLED is placing the films precisely at the desired location. There are two conventional technologies for performing this task, depending on the method of film deposition. For thermal evaporation, shadow masking is used to form OLED films of a desired configuration. Shadow masking techniques require placing a well-defined mask over a region of the substrate followed by depositing the film over the entire substrate area. Once deposition is complete, the shadow mask is removed. The regions exposed through the mask define the pattern of material deposited on the substrate. This process is inefficient, as the entire substrate must be coated, even though only the regions exposed through the shadow mask require a film. Furthermore, the shadow mask becomes increasingly coated with each use, and must eventually be discarded or cleaned. Finally, the use of shadow masks over large areas is made difficult by the need to use very thin masks (to achieve small feature sizes) that make the masks structurally unstable. However, the vapor deposition technique yields OLED films with high uniformity and purity and excellent thickness control.

For solvent deposition, ink jet printing can be used to deposit patterns of OLED films. Ink jet printing requires dissolving organic material into a solvent that yields a printable ink. Furthermore, ink jet printing is conventionally limited to the use of single layer OLED film stacks, which typically have lower performance as compared to multilayer stacks. The single-layer limitation arises because printing typically causes destructive dissolution of any underlying organic layers. Finally, unless the substrate is first prepared to define the regions into which the ink is to be deposited, a step that increases the cost and complexity of the process, ink jet printing is limited to circular deposited areas with poor thickness uniformity as compared to vapor deposited films. The material quality is also typically lower, due to structural changes in the material that occur during the drying process and due to material impurities present in the ink. However, the ink jet printing technique is capable of providing patterns of OLED films over very large areas with good material efficiency.

No conventional technique combines the large area patterning capabilities of ink jet printing with the high uniformity, purity, and thickness control achieved with vapor deposition for organic thin films. Because ink jet processed single layer OLED devices continue to have inadequate quality for widespread commercialization, and thermal evaporation remains impractical for scaling to large areas, it is a major technological challenge for the OLED industry to develop a technique that can offer both high film quality and cost-effective large area scalability.

Finally, manufacturing OLED displays may also require the patterned deposition of thin films of metals, inorganic semiconductors, and/or inorganic insulators. Conventionally, vapor deposition and/or sputtering have been used to deposit these layers. Patterning is accomplished using prior substrate preparation (e.g., patterned coating with an insulator), shadow masking as described above, and when a fresh substrate or protective layers are employed, conventional photolithography. Each of these approaches is inefficient as compared to the direct deposition of the desired pattern, either because it wastes material or requires additional processing steps. Thus, for these materials as well there is a need for a method and apparatus for depositing high-quality, cost effective, large area scalable films.

SUMMARY OF VARIOUS EMBODIMENTS

An exemplary and non-limiting summary of various embodiments is set forth next.

In accordance with various embodiments, for example, apparatus and methods are provided for depositing one or more materials on one or more substrates. In various embodiments, such one or more materials can comprise one or more films. In some embodiments, such one or more films can comprise one or more solids. In some embodiments, one or more inks are deposited on one or more substrates.

In accordance with various embodiments, apparatus are provided for depositing one or more materials (e.g., one or more films, such as one or more solids) on one or more substrates. In some embodiments, an apparatus of the present teachings can include one or more of: (i) a chamber for receiving ink; (ii) a discharge nozzle disposed in spaced relation to the chamber and including a plurality of micro-pores, with each micro-pore including a first end region defining an inlet port, confronting the chamber, and a second end region defining an outlet port; and (iii) a plurality of orifices (also referred to as ports) in fluid communication with the chamber, with the orifices being adapted to meter droplets of ink from the chamber along separate respective delivery paths to respective spaced-apart locations on the inlet ports of the discharge nozzle. In various embodiments, the chamber receives ink in liquid form, with the ink being defined by a plurality of substantially solid particles dissolved or suspended in a carrier liquid, and the droplets of ink are pulsatingly metered from the chamber through the orifices to the discharge nozzle; and the discharge nozzle evaporates the carrier liquid and deposits the substantially solid particles on the substrate(s).

Further embodiments of apparatus for depositing one or more materials (e.g., one or more films, such as one or more solids) on one or more substrates, in accordance with aspects of the present teachings, can include, for example, one or more of: (i) a chamber configured to hold a liquid, such as liquid ink; (ii) a plurality of orifices disposed for fluid communication with the chamber, the orifices being of a size (e.g., diameter, or cross-sectional area orthogonal to the longitudinal axis of the orifice) to normally prevent the passage of ink therethrough, such as by surface tension forces; (iii) one or more chamber activators (e.g., one or more heater(s) and/or piezoelectric material(s)) operably coupled to the chamber and/or orifices, adapted to provide energy sufficient to substantially simultaneously eject plural droplets of the liquid from the chamber via each orifice of the plurality of orifices (e.g., one droplet from each orifice); (iv) a discharge nozzle disposed in spaced relation to the chamber and including a plurality of micro-pores, which define an array, with each micro-pore including a first end region defining an inlet port, confronting the chamber, and a second end region, facing away from the chamber, defining an outlet port; (v) a plurality of spaced-apart delivery paths, each extending from a respective one of the orifices to a respective, unique location on the inlet ports of the discharge nozzle; and (vi) one or more nozzle activators (e.g., one or more heater(s) and/or piezoelectric material(s)) operably coupled to the discharge array, adapted to provide energy sufficient to discharge the material from the micro-pores, e.g. by heating the micro-pores to one or more selected temperatures and/or through a selected temperature range (e.g., approximately 100 degrees Celsius to approximately 300 degrees Celsius).

In some embodiments, two or more (e.g., three) orifices are disposed for fluid communication with the chamber, and the micro-pore array defines a rectangle having a long dimension and a short dimension. Further, a line defined by the orifices is disposed parallel to the long axis of the rectangular array. In other embodiments, two or more (e.g., three) orifices are disposed for fluid communication with the chamber, and the array of micro-pores forms a non-rectangular array, such as an array having a chevron or triangular shape. Further, the three orifices are arranged to achieve optimal (e.g., maximal) coverage of the micro-pore array upon ejecting plural droplets of ink from the chamber, along respective delivery paths, and onto the micro-pore array.

According to various embodiments, methods are provided for depositing one or more materials (e.g., one or more films, such as one or more solids) on one or more substrates. In some embodiments, for example, methods of the present teachings can include one or more of the steps: (a) providing liquid ink to a chamber, the liquid ink defined by a plurality of particles dissolved or suspended in a carrier liquid; (b) pulsatingly energizing at least two spaced-apart orifices, each disposed in fluid communication with the chamber, to substantially simultaneously meter from each orifice a droplet of liquid ink from the chamber; (c) substantially simultaneously passing the metered droplets of ink along separate, respective delivery paths to respective spaced-apart locations on a discharge nozzle; (d) receiving the metered droplets of ink at the discharge nozzle, the discharge nozzle including a plurality of micro-pores for directing the metered droplets of ink; (e) heating the ink at the plurality of micro-pores to evaporate the carrier liquid, thereby rendering said plurality of particles substantially free of carrier liquid; and (f) discharging the plurality of particles from the micro-pores onto the substrate; whereby the plurality of particles are deposited on the substrate(s) in substantially solid form.

Further embodiments of methods for depositing one or more materials (e.g., one or more films, such as one or more solids) on one or more substrates in accordance with the present teachings can include, for example, one or more of the steps: (a) retaining a volume of liquid ink in a holding region, with the liquid ink comprising a plurality of particles dissolved or suspended in a carrier liquid; (b) delivering energy (e.g., thermal and/or mechanical) to the holding region, thereby substantially simultaneously ejecting a plurality of droplets of liquid ink from at least two spaced-apart locations along the holding region such that each droplet is passed along a respective delivery path to a unique location along a plane adjacent the holding region; (c) subdividing each of the ejected droplets into a plurality of micro-volumes of liquid ink, each micro-volume disposed in a respective micro-holding region immediately adjacent the plane; (d) heating the micro-holding regions to a first temperature (e.g., 100 degrees Celsius) such that the carrier liquid evaporates, thereby providing solid particles in the micro-holding regions that are substantially free of carrier liquid; (e) heating the micro-holding regions to a second temperature (e.g., 300 degrees Celsius) such that the solid particles therein are vaporized into a gas; and (f) directing the gas out of the micro-holding regions (e.g., by application of energy, such as heat and/or mechanical) and onto a substrate adjacent thereto, upon which it solidifies. In various embodiments, a film is thereby formed.

BRIEF DESCRIPTION OF FIGURES

These and other embodiments of the disclosure will be discussed with reference to the following non-limiting and exemplary illustrations, in which like elements are numbered similarly, and where.

DESCRIPTION OF VARIOUS EMBODIMENTS

Figure 1A:
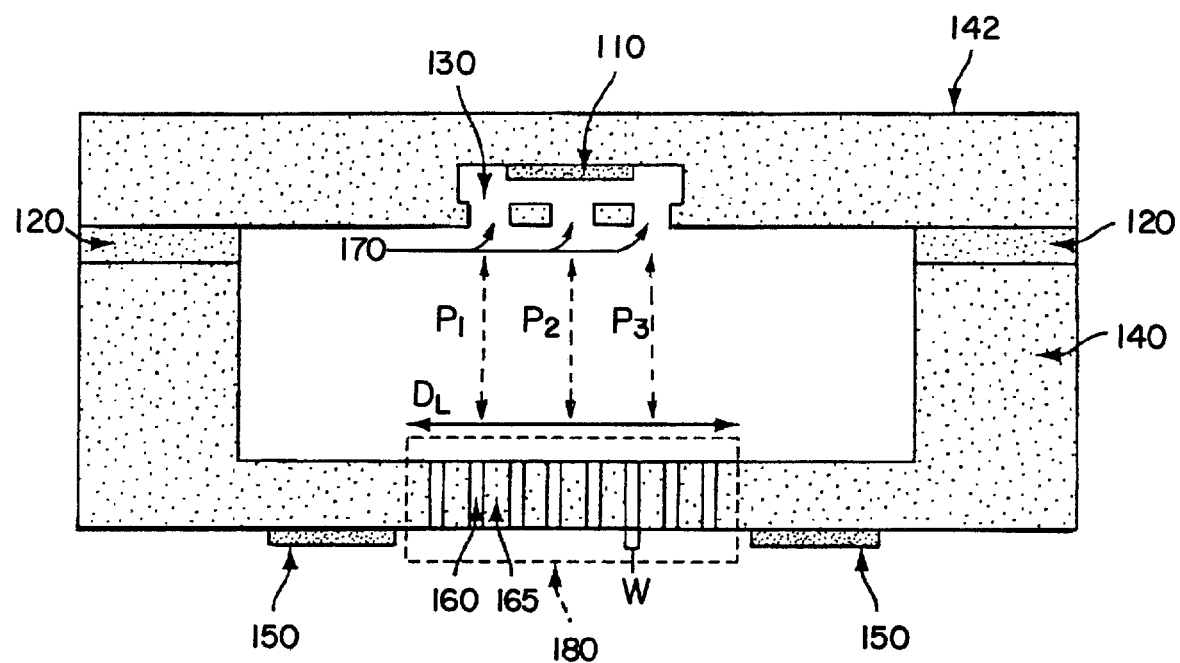
FIG. 1A is a side sectional schematic representation of an exemplary print-head, including a thermal ink dispensing mechanism and a discharge nozzle, according to the present teachings, as contemplated by various embodiments.

Reference will now be made to various non-limiting and exemplary embodiments.

In accordance with various embodiments, the present teachings relate to methods and apparatus for depositing one or more materials (e.g., one or more films, such as one or more solids) on one or more substrates. Such films can be used, for example, in the design and construction of OLEDs and large area transistor circuits. Materials that can be deposited by the apparatus and methods herein include, among other things, organic materials, metal materials, and inorganic semiconductors and insulators, such as inorganic oxides, chalcogenides, Group IV semiconductors, Group III-V compound semiconductors, and Group II-VI semiconductors.

Further, the present teachings relate, in various embodiments, to an ink dispenser and a discharge nozzle which, in combination, comprise a print-head. According to various embodiments, the dispenser can be, for example, an inkjet and the nozzle can be adapted to discharge a film of material in a substantially dry or solid form. In various embodiments, the discharged film material can be deposited upon one or more substrates.

The present teachings can be embodied and/or implemented, for example, in apparatus and methods as taught in U.S. Patent Application No. US 2008/0311307 A1 (herein, the '307 disclosure), which is expressly incorporated herein by reference in its entirety.

In some configurations of a print-head apparatus, and/or applications therefore, an inkjet dispenser having no more than a single orifice for ejecting liquid ink onto a single discharge nozzle may be satisfactory and desirable. The present teachings contemplate, however, some configurations of a print-head apparatus, and/or applications therefore, where desired results cannot be achieved with a single-orifice inkjet for ejecting liquid ink onto a single discharge nozzle. The present teachings provide, among other things, an inkjet dispenser having plural (i.e., more than one) orifices for ejecting liquid ink onto a single discharge nozzle. For example, various embodiments of print-head apparatus of the '307 disclosure can be configured with plural (e.g., 2, 3, 4, 5, 6, or more) orifices per chamber for holding liquid ink. Thus, upon activation, plural droplets of ink can be ejected from the chamber. Further, the activation means (e.g., energy source or sources, such as thermal and/or mechanical) for ejecting ink can be configured so that the plural droplets (e.g., three droplets for a chamber having three orifices communicating therewith) are ejected substantially simultaneously. In addition, the activation means can be configured so that the plural droplets are ejected serially from each orifice.

In some configurations of a print-head apparatus of the present teachings, as further discussed herein, plural droplets can be deposited onto a single target micro-pore array utilizing orifices directed at the array from plural ink-holding chambers. In various embodiments, for example, each of multiple chambers associated with a target micro-pore array includes one or more orifices for delivering liquid ink droplets thereto. In some such embodiments, each of the multiple chambers includes no more than a single orifice for delivering liquid ink droplets. For example, in some embodiments (not shown), three droplets of ink can be delivered from three distinct orifice-chamber pairs to accomplish the same result as when utilizing a print-head apparatus, such as taught herein, having three orifices provided in a single ink-holding chamber.

As further discussed below, there are various configurations of a print-head apparatus in which it may be desirable to employ an inkjet having plural orifices per chamber for holding liquid ink. One such configuration is a print-head apparatus having an inkjet with a chamber for holding liquid ink, and an adjacent discharge nozzle with an array of micro-pores, where the micro-pore array is larger, in at least one dimension, than the size of a droplet of ink ejected from the inkjet. If only a single inkjet is used in such a configuration, which has no more than a single orifice for ejecting ink from the liquid-holding chamber, it may be necessary to eject multiple droplets of ink in series when endeavoring to wet the entire micro-pore array with liquid ink. In some such single-orifice configurations, it should be noted, it may not be possible or practicable to wet the entire array, even upon firing of multiple droplets of ink at the micro-pore array in series.

FIG. 1A is a schematic representation of an apparatus for depositing material, according to various embodiments of the present teachings. FIG. 1A provides a schematic representation of a thermal jet print-head, including a thermal ink dispensing mechanism and a discharge nozzle, according to various embodiments.

Referring to FIG. 1A, an exemplary apparatus for depositing a material on a substrate comprises a chamber 130, plural orifices 170, a discharge nozzle 180, and plural micro-porous conduits 160; the latter also referred to as micro-pores. Chamber 130 receives ink in liquid form and communicates the ink from orifices 170 to discharge nozzle 180. The ink can comprise, for example, suspended or dissolved particles in a carrier liquid or solvent. These particles can comprise, for example, single molecules or atoms, aggregations of molecules and/or atoms, or any combination thereof. In the illustrated embodiment, the path between each orifice 170 and a respective location on discharge nozzle 180 defines three separate, spaced-apart, respective delivery pathways, depicted by dashed lines denoted as $P_1$, $P_2$, and $P_3$.

In the embodiment of FIG. 1A, discharge nozzle 180 comprises micro-pores 160 separated by partitions 165. Micro-pores 160 can include, according to some embodiments, micro-porous material therein. A surface of discharge nozzle 180 proximal to orifices 170 defines inlet ports to discharge nozzle 180, while the distal surface of discharge nozzle 180, facing away from orifices 170, defines outlet ports. A substrate (not shown) can be positioned proximal to the outlet ports of discharge nozzle 180 for receiving ink deposited therefrom.

The thermal jet print-head of FIG. 1A further includes bottom structure 140, which receives discharge nozzle 180. Discharge nozzle 180 can be fabricated as part of the bottom structure 140. Alternatively, discharge nozzle 180 can be manufactured separately and later combined with bottom structure 140 to form an integrated structure. Top structure 142 receives chamber 130. Top structure 142 can be formed with appropriate cavities and conduits to form chamber 130.

Top structure 142 and bottom structure 140 are coupled through bonds 120 to form a housing structure. The housing allows the thermal jet print-head to operate under pressure or in vacuum. The housing may further comprise an inlet port (not shown) for accepting a transport gas for carrying the material from the discharge nozzle to the substrate (not shown). Alternatively, a port (not shown) can be integrated into top structure 142 to receive transport gases. The port can include a flange adapted to receive a transport gas, which, according to one embodiment, comprises a substantially inert mixture of one or more gases. The mixture can include gases which are substantially non-reactive with the materials being deposited by the apparatus, such as nitrogen or argon when used with typical organic materials. The transport gas can transport particles away from discharge nozzle 180 by flowing through micro-pores 160.

It is to be noted that integration of an inkjet head and a discharge nozzle is optional. It will be appreciated by those skilled in the art that an inkjet head and discharge nozzle, as contemplated herein, can be arranged and utilized as physically separate units. The present teachings contemplate various embodiments comprising an inkjet head and discharge nozzle disposed in configurations wherein such components are arranged and utilized as physically separate units.

A heater 110 can be added, optionally, to chamber 130 for heating and/or dispensing the ink. In FIG. 1A, heater 110 is positioned inside chamber 130. Heater 110 can be any thermal energy source(s) operably coupled to chamber 130 and/or orifices 170 for providing pulsating energy to the liquid ink and thereby discharge a respective droplet of the liquid ink through each orifice 170. In one embodiment, heater 110 delivers heat in pulses having a duration of one minute or less. For instance, the heater can be energized with square pulses having a variable duty cycle and a cycle frequency of 1 kHz. Thus, the heater energy can be used to meter the quantity of ink delivered from chamber 130 to discharge nozzle 180. Chamber 130 may also contain material, other than ink, useful for forming a film used in the fabrication of an OLED or transistor. Orifices 170 can be configured such that surface tension of the liquid in chamber 130 prevents discharge of the liquid prior to activation of the mechanism for dispensing the ink.

In general, one can employ any suitable energy source coupled to chamber 130 that is capable of providing energy sufficient to eject droplets of liquid ink from orifices 170; for instance, mechanical (e.g., vibrational). In one embodiment, according to the present teachings, a piezoelectric material is used instead of, or in addition to, heater 110. In another embodiment, each orifice 170 is coupled to a separate heater and/or piezoelectric material. In the latter embodiment, for example, three heating elements can be provided; one for (and proximate to) each orifice 170.

In the embodiment of FIG. 1A, discharge nozzle 180 includes partitions (or rigid portions) 165 separated by conduits or micro-pores 160. Micro-pores 160 and rigid portions 165 can collectively define a micro-porous environment. The micro-porous environment can comprise a variety of materials, including, micro-porous alumina or solid membranes of silicon or silicon carbide and having micro-fabricated pores. Micro-pores 160 are configured to prevent the material dissolved or suspended in the liquid from escaping through discharge nozzle 180 until the medium is appropriately activated. When the discharged droplets of liquid encounter discharge nozzle 180, the liquid is drawn into micro-pores 160 with assistance from capillary action. The liquid in the ink may evaporate prior to activation of discharge nozzle 180, leaving behind a coating of the suspended or dissolved particles on the micro-pore walls.

The carrier liquid can comprise, for example, one or more solvents. The liquid in the ink may comprise one or more solvents with a relatively-low vapor pressure. Alternatively or in addition, the liquid in the ink may comprise one or move solvents with a relatively-high vapor pressure. The one or more solvents can have a vapor pressure such that during the transportation and deposition process the solvent is substantially evaporated and the plurality of particles in the carrier liquid is deposited as solid particles. Thus, the deposited plurality of solid particles can comprise a film on the substrate.

The evaporation of the liquid in the ink may be facilitated or accelerated by heating the discharge nozzle. The evaporated liquid can be removed from the chamber and subsequently collected (not shown), for instance, by flowing gas over one or more of the discharge nozzle faces. Depending on the desired application, micro-pores 160 can provide conduits (or passages) having a minimum linear cross-sectional distance W of a few nanometers to hundreds of microns. The micro-porous region comprising discharge nozzle 180 will take a different shape and cover a different area (e.g., rectangular, L-shaped, triangular, chevron-shaped, etc.) depending on the desired application, with a typical maximum linear cross-sectional dimension $D_L$ ranging from a few hundred nanometers to tens or hundreds of millimeters. In one embodiment, the ratio of W/D is in a range of about 1/5 to about 1/1000.

In the exemplary apparatus of FIG. 1A, discharge nozzle 180 is actuated by nozzle heater 150. Nozzle heater 150 is positioned proximal to discharge nozzle 180. Nozzle heater 150 may comprise a thin metal film. The thin metal film can be comprised of, for example, platinum. When activated, nozzle heater 150 provides pulsating thermal energy to discharge nozzle 180, which acts to dislodge the material contained within micro-pores or conduits 160, which can subsequently flow out from the discharge nozzle. In one embodiment, the pulsations can be variable on a time scale of one minute or less.

Nozzle heater 150 can be adapted to heat the material in discharge nozzle 180 to a desired temperature or temperatures, or across a range of temperatures. For example, in various embodiments nozzle heater 150 heats the material in discharge nozzle 180 to one or more temperatures within a range of from about 75 degrees Celsius to about 500 degrees Celsius. In some embodiments, nozzle heater 150 heats the material in discharge nozzle 180 to a temperature within a range of from about 100 degrees Celsius to about 400 degrees Celsius.

Dislodging the ink particles may include vaporization, either through sublimation, or melting and subsequent boiling. In one embodiment, the material (e.g., ink particles in a carrier liquid) in discharge nozzle 180 is initially heated to about 100 Celsius to evaporate carrier liquids. The remaining solids (e.g., ink particles which are free, or substantially free, of solvents) are then heated to about 300 Celsius, such that they are turned into a gas. Thereafter, the gas can be deposited onto a substrate, where it solidifies. One or more films can be formed thereby.

It should be noted again that the term particles is used generally, and includes, for example, anything from a single molecule or atom to a cluster of molecules or atoms, as well as combinations of the foregoing. In general, one can employ any suitable energy source coupled to the discharge nozzle that is capable of energizing discharge nozzle 180 and thereby discharging the material from micro-pores 160; for instance, mechanical (e.g., vibrational). In one embodiment of the present teachings, a piezoelectric material is used instead of, or in addition to, nozzle heaters 150.

As described above, in the apparatus depicted in FIG. 1A, multiple orifices 170 are present, each being adapted for fluid communication with chamber 130. The number of orifices can vary, and the number selected for a particular apparatus can be determined according to various factors, such as those further described below. In short, the number of orifices can be selected, for example, based upon the size and/or shape of an array defined by micro-pores 160 (e.g., rectangular, L-shaped, triangular, chevron-shaped, etc.); and the size of a droplet (the term "size," in this context, referring to the average or mean diameter of one or more droplets after landing and spreading over the inlet surface of a discharge nozzle) of liquid ink ejected from an orifice.

Figure 1B:
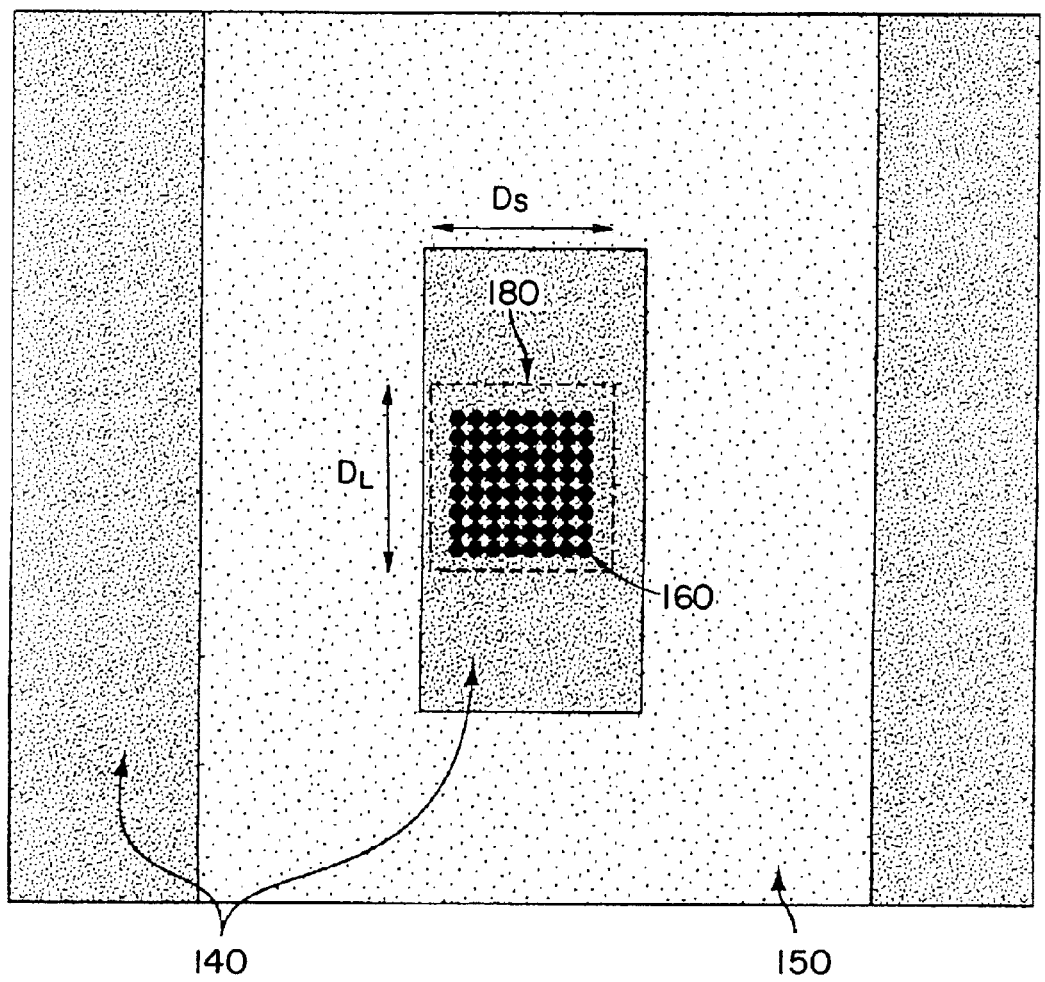
FIG. 1B is a schematic bottom-plan view of an exemplary implementation of the discharge nozzle, comprising a rectangular array of micro-pores, according to the present teachings, as contemplated by various embodiments.

FIG. 1B is a diagram of a discharge nozzle 180, as part of an apparatus for depositing a film on a substrate, according to various embodiments. In FIG. 1B, discharge nozzle heater 150 is comprised of a thin platinum film on a silicon housing 140. In the center of discharge nozzle 180 are also shown discharge nozzle micro-pores 160. In the depicted embodiment, the micro-pores 160 define a regular, rectangular array, with the dimension denoted as "$D_L$" being the long dimension of the array and the dimension denoted as "$D_S$" being the short dimension of the array. With additional reference to FIG. 1A, orifices 170 define a line and micro-pores 160 define a substantially planar rectangular array. The line defined by orifices 170 is disposed substantially parallel to the long dimension, "$D_L$," of the rectangular array.

As indicated above, the teachings herein can be embodied and/or implemented in apparatus and methods as taught in U.S. Patent Application No. US 2008/0311307 A1 (herein, the '307 disclosure), which is expressly incorporated herein by reference in its entirety.

As described herein, the various embodiments of print-head apparatus of the '307 disclosure can be configured with plural (e.g., 2, 3, 4, 5, 6, or more) orifices per chamber for holding liquid ink. Thus, upon activation, plural droplets of ink can be ejected from the chamber. Further, the activation means (e.g., energy source or sources, such as thermal and/or mechanical) can be configured so that the plural droplets (e.g., three droplets for a chamber having three orifices communicating therewith) are ejected substantially simultaneously. In addition, the activation means can be configured so that the plural droplets can be ejected serially from each orifice.

Various configurations of a print-head apparatus in which it may be desirable to employ plural orifices per chamber for holding liquid ink include a configuration where an associated discharge nozzle includes a plurality of micro-pores disposed in an array adjacent the inkjet, with (i) the area of the micro-pore array, and/or (ii) at least one linear dimension of the micro-pore array, being larger (e.g., 1.5×, 3×, 5×, 10×, 20×, or more) than the size of a droplet of ink (e.g., with reference to the droplet average or mean diameter after impacting and spreading upon the inlet surface of a discharge nozzle) ejected from the inkjet. For example, with a rectangular array of micro-pores, utilizing no more than a single inkjet comprising an ink-holding chamber having no more than a single orifice for ejecting ink from the chamber, it may be required to eject multiple droplets of ink in series in order to wet the entire rectangular array with liquid ink. In some configurations of such a single-orifice inkjet, however, it may be difficult, impossible, or impracticable to wet the entire array, notwithstanding such firing of multiple droplets of ink at the micro-pore array in series.

In some embodiments of the present teachings, two or more (e.g., three) orifices are disposed for fluid communication with a liquid-holding chamber, and a micro-pore array of a discharge nozzle defines a rectangle having a long dimension and a short dimension. Further, a line defined by the orifices is disposed parallel to the long axis of the rectangular array. In other embodiments, two or more (e.g., three) orifices are disposed for fluid communication with the chamber, and the array of micro-pores forms a non-rectangular array, such as (among others) an array having a chevron or triangular shape. Further, the three orifices can be arranged to achieve optimal (e.g., maximal) coverage of liquid ink on the inlets of the micro-pore array after the plural (e.g., triplet) droplets of ink ejected from the chamber impact and spread upon the micro-pore array.

An embodiment of the present teachings, thus, can consist of a three-orifice inkjet liquid ink dispenser, in contrast to a single-orifice inkjet liquid ink dispenser. The orifices of the inkjet can be arrayed adjacent to (for example, above) the discharge nozzle. The three-orifice inkjet can simultaneously emit three drops (i.e., one drop from each of its three ports), which droplets move toward, land and spread on the discharge nozzle.

Figure 2A:
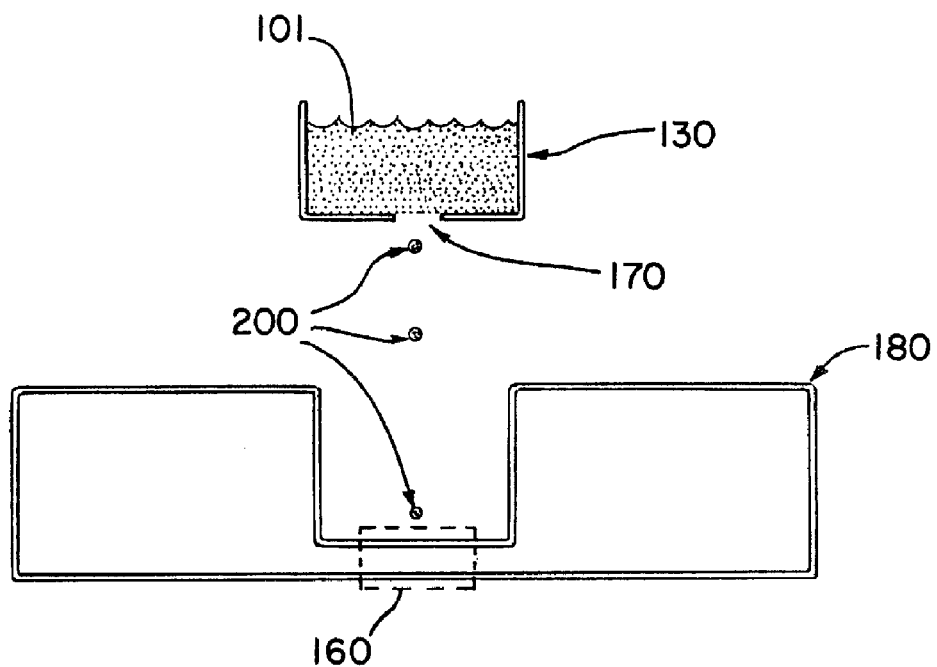
FIG. 2A is a side view, with portions shown in section, schematically depicting selected components of a print-head having an inkjet with a single ink-ejecting orifice and a discharge nozzle with an array of micro-pores. The inkjet is depicted firing single droplets of ink along a common delivery pathway towards a common location on the array of micro-pores.
Figure 2B:
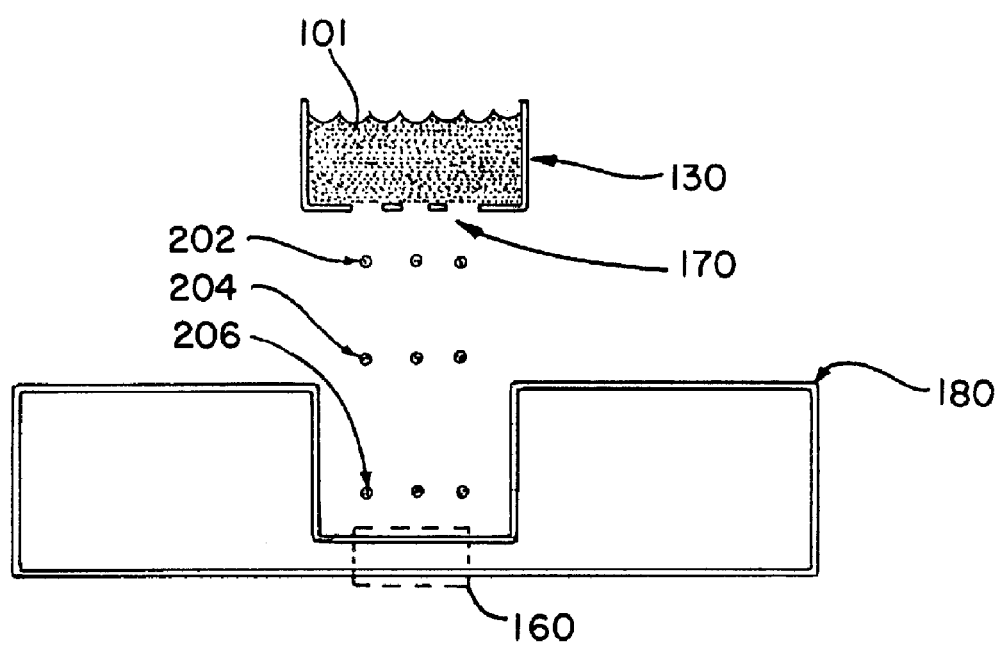
FIG. 2B is a side view, with portions shown in section, schematically depicting selected components of a print-head, according to various embodiments of the present teachings, having an inkjet with three ink-ejecting orifices and a discharge nozzle with an array of micro-pores. The inkjet is depicted firing triplets of droplets of ink along three respective delivery pathways towards unique locations on the array of micro-pores.

Reference is now made to FIG. 2A and FIG. 2B, wherein elements that are like or substantially similar to those shown and described in connection with FIG. 1A and FIG. 1B are denoted by like reference numerals. FIG. 2A and FIG. 2B schematically represent apparatus for depositing material, with FIG. 2A depicting an embodiment within the teachings of the '307 application and FIG. 2B depicting an embodiment in accordance with the teachings of the present disclosure. More particularly, FIG. 2A provides a schematic representation of selected components of a thermal-jet print-head, including a chamber 130 holding liquid ink 101 comprising particles in a carrier liquid, and having a single orifice 170 in fluid communication with chamber 130. Also shown is a discharge nozzle 180 disposed in spaced relation to chamber 130, with discharge nozzle 180 including a micro-pore array in the region denoted by the dashed-line rectangle at 160. Three droplets are shown at 200, having been ejected from chamber 130 in series towards micro-pore array 160. Each of the three droplets is depicted at a respective location along a substantially linear delivery pathway between chamber 130 and a common target location on micro-pore array 160.

FIG. 2B provides a schematic representation of an exemplary embodiment of selected components of a thermal-jet print-head according to the teachings of the present disclosure, including a chamber 130 holding liquid ink 101 comprising particles in a carrier liquid, and having three orifices, indicated generally at 170, in fluid communication with chamber 130. Also shown is a discharge nozzle 180 disposed in spaced relation to chamber 130, with discharge nozzle 180 including a micro-pore array in the region denoted by the dashed-line rectangle at 160. Three triplets of droplets are shown at 202, 204, and 206, having been ejected (e.g., in a manner described above with reference to FIG. 1A) from chamber 130 in series towards micro-pore array 160. Each droplet of each of the triplets of droplets is depicted at a respective location along a substantially linear delivery pathway between chamber 130 and a respective target location on micro-pore array 160. Thus, each one of the three orifices directs droplets ejected therefrom to a unique target location on the micro-pore array via a respective delivery pathway.

Figure 3A:
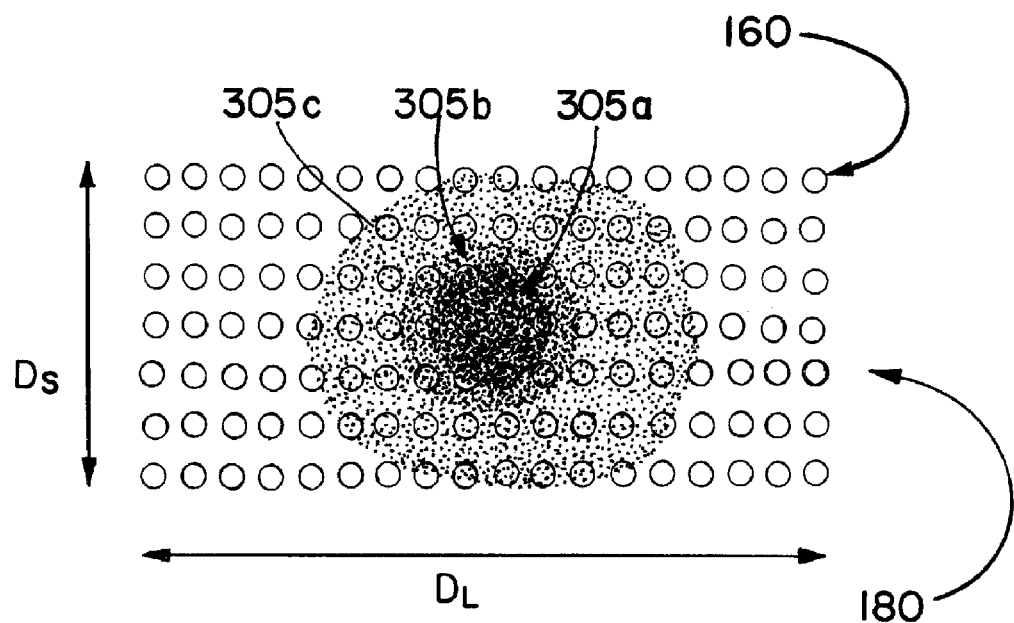
FIG. 3A is a top view schematically depicting liquid ink spread over inlets of a rectangular array of micro-pores after impact of droplets fired by the print-head of FIG. 2A.

FIG. 3A is a top view schematically depicting results to be obtained from use of the print-head of FIG. 2A (i.e., a single-chamber, single-orifice inkjet firing single droplets, one at a time). As previously discussed, when at least one linear dimension of the area defined by a micro-pore array, such as the rectangular array of micro-pores 160 of discharge nozzle 180 shown in FIG. 3A, is larger than the diameter of a droplet, firing of one or more droplets from a single-orifice chamber of an inkjet towards a common location on the array can provide inadequate results, since the droplets can fail to spread upon and wet a substantial portion of the area of the array after impact. In practice, using the print-head of FIG. 2A, a single drop is dispensed and moved through space under the influence of any suitable ejection force and body forces (such as gravity), and then lands on and wets a subset of the micro-pores of the array of the discharge nozzle. As depicted, each droplet will initially wet the center of its targeted area and then, upon spreading outward, successively wet larger areas: firstly the area 305a, secondly the area 305b, and lastly and maximally the area 305c. Even the area corresponding to 305c covers less than half of the micro-pore area, and in many applications this amount of coverage is inadequate.

Figure 3B:
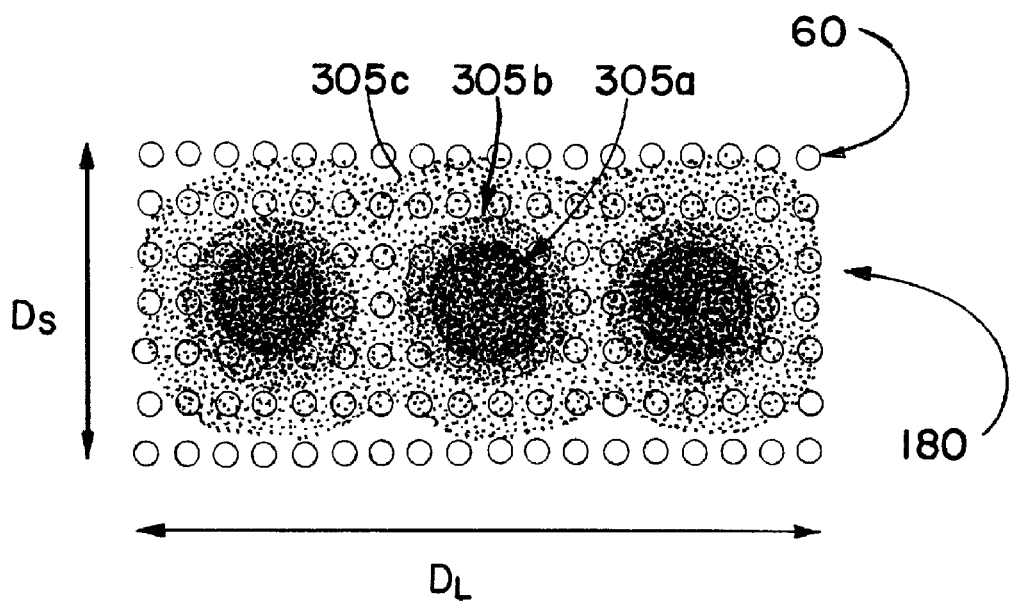
FIG. 3B is a top view schematically depicting liquid ink spread over inlets of a rectangular array of micro-pores after impact of triplets of droplets fired by the print-head of FIG. 2B, according to various embodiments of the present teachings.

However, in accordance with the present teachings, when a plurality of orifices (e.g., three) are used to simultaneously eject multiple droplets of liquid ink from a liquid-holding chamber of an inkjet, e.g., using the three-orifice print-head of FIG. 2B, wetting of the rectangular array will be more uniform, as shown in FIG. 3B. Particularly, each of the droplets spreads out upon impact at its respective target location on the micro-pore array, with radially distal portions of each droplet coalescing with liquid ink from its adjacent neighbor(s). The three impact points can be selected to maximize coverage of the micro-pore array with liquid ink after impact of the droplets. As a result, a greater fraction of the micro-pores of the array will receive ink.

Figure 3C:
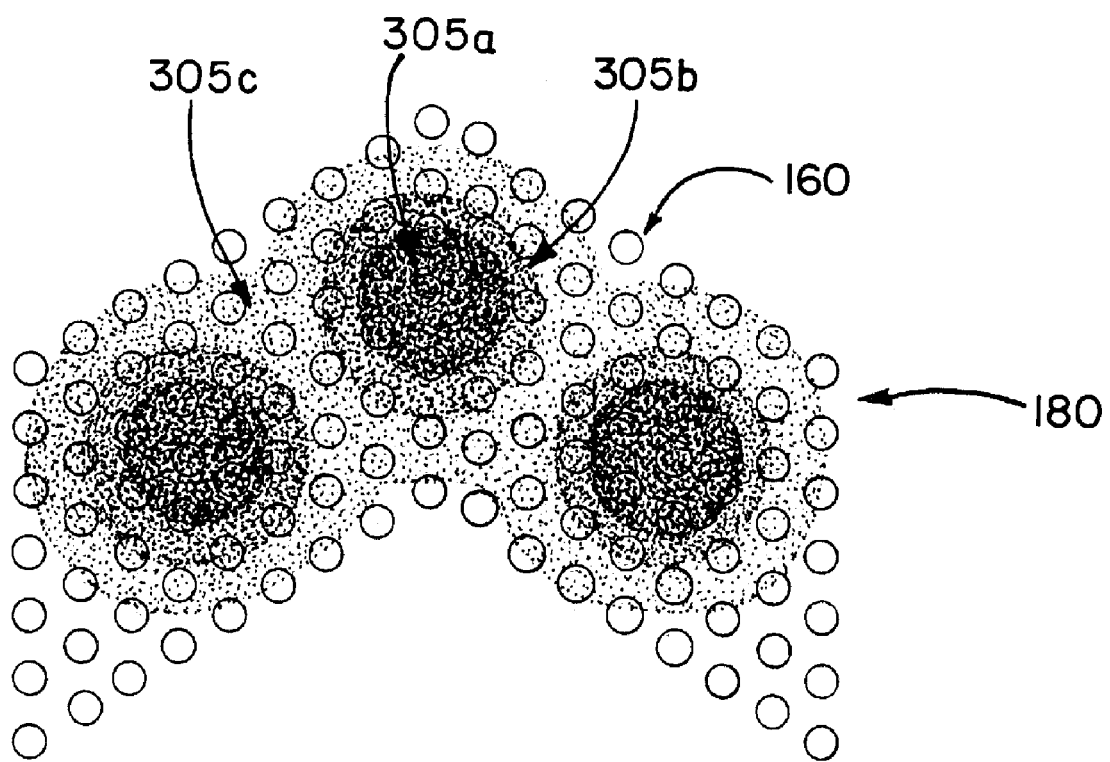
FIG. 3C is a top view schematically depicting liquid ink spread over inlets of a chevron-shaped array of micro-pores after impact of triplets of droplets fired by an inkjet adapted to eject triplets of droplets simultaneously to form a chevron-like shape, according to various embodiments of the present teachings.

FIG. 3C is a top view schematically depicting liquid ink spread over inlets of a chevron-shaped array of micro-pores after impact of triplets of droplets fired by an inkjet adapted to eject triplets of droplets simultaneously in a chevron-like shape.

Certain additional aspects of U.S. Patent Application No. US 2008/0311307 A1, expressly incorporated herein by reference in its entirety, can be employed in connection with the teachings of the present disclosure. For example, aspects of the process of depositing a solvent-free material, described in the '307 application, can be utilized herein; e.g., with a print-head having a multi-orifice inkjet, in accordance with the present teachings. Further, for example, multiple print-heads of the present teachings can be arrayed in an apparatus having multiple discharge nozzles, each with a corresponding multi-orifice inkjet. Still further, for example, one or more reservoirs can supply liquid ink to the chamber(s) of a print-head apparatus of the present teachings. In some embodiments contemplated herein, print-heads of the present teachings are arrayed together, with multiple reservoirs supplying ink to one or more associated liquid-holding chambers. In various embodiments, a target array of micro-pores intended to receive liquid ink is circumscribed by a retaining wall which forms a confining well to mechanically confine ink, and/or other material, supplied to the inlets of the micro-pores. According to various embodiments, a positioning system is employed for adjusting the position of the print-head or print-head array. In addition, or as an alternative, a substrate-positioning system can be employed. In some embodiments, the sidewalls of the micro-pores can have defined non-cylindrical geometries, e.g. they can be tapered such that the diameter of each micro-pore increases in a direction from the inlet end to the outlet end. In various embodiments herein, a control system can be provided for controlling a print-head having a multi-orifice liquid-holding chamber and a discharge nozzle. Still other aspects of the '307 disclosure which can be adapted for use in connection with the teachings of the present disclosure can be selected and implemented by those skilled in the art.

As previously discussed, in some configurations of a print-head apparatus, in accordance with the present teachings, multiple droplets can be deposited onto a single target micro-pore array, e.g., substantially simultaneously, utilizing orifices directed at the array from multiple associated ink-holding chambers. In various embodiments of a print-head apparatus (not shown), for example, each of multiple chambers associated with a single target micro-pore array includes one or more orifices for delivering liquid ink droplets to the target micro-pore array. In some such embodiments, each of the multiple chambers includes no more than a single orifice for delivering liquid ink droplets. For example, in some embodiments (not shown), three droplets of ink can be delivered, e.g., substantially simultaneously, from three distinct orifice-chamber pairs (i.e., each of three separate chambers is configured with no more than a single orifice for ejecting a droplet of liquid ink, in a serial fashion if desired) to accomplish the same result as when utilizing a print-head apparatus, such as taught herein, having three orifices provided in a single ink-holding chamber. In one embodiment (not shown), for example, three separate chambers are disposed proximate one another, e.g., side-by-side. The three chambers can be configured, for example, in a common housing, separate housings (which can be attached or mounted proximate one another), or a combination thereof. Each of the three chambers holds a liquid ink (which may be the same ink or different inks) to be deposited onto a single associated target array of micro-pores (e.g., a rectangular array of micro-pores). Each of the three chambers, in this embodiment, includes no more than one orifice for delivering liquid ink droplets thereto. Three delivery pathways, along which respective droplets can be directed, are defined by respective lines extending from each orifice to respective, spaced-apart locations on the single target micro-pore array.

Figure 4:
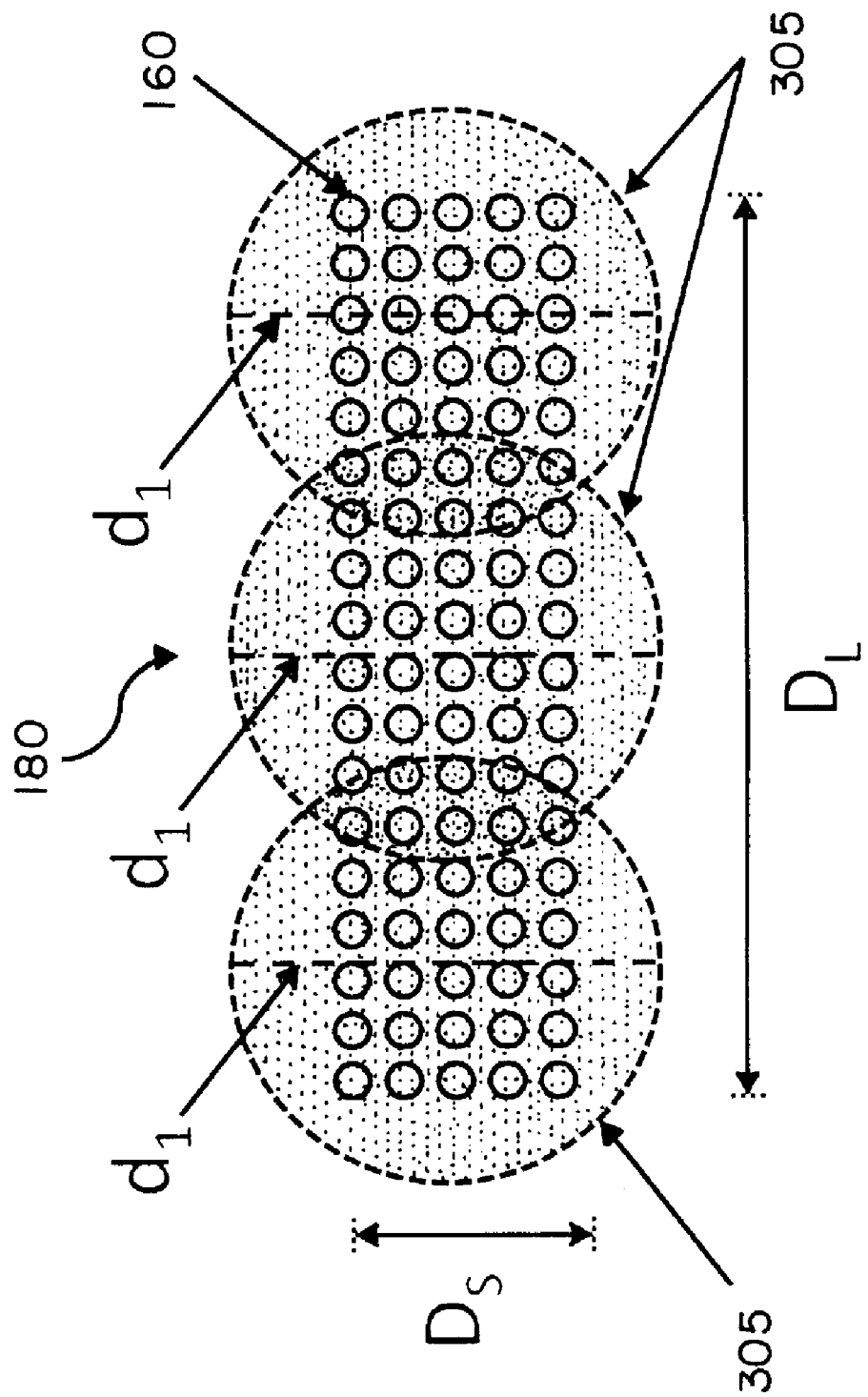
FIG. 4 is a top view schematically depicting a triplet of liquid ink droplets spread over inlets of a rectangular array of micro-pores after impact, with each droplet being smaller in diameter than the long dimension of the array and being larger in diameter than the short dimension of the array, according to various embodiments of the present teachings.

In various embodiments, according to the present teachings, it is preferred to deposit plural droplets onto a target micro-pore array such that the droplets overfill the area defined by the array. Some such embodiments include, for example, configurations where a micro-pore array comprises at least two dimensions of differing lengths (e.g., first and second linear dimensions, which can be orthogonal to one another, with the first dimension being longer than the second dimension), and the longest linear dimension of the micro-pore array is larger than the diameter of the droplets (e.g., the average or mean diameter as measured after impacting and spreading upon the inlet surface of a discharge nozzle), but the shortest linear dimension of the micro-pore array is smaller than the diameter of the droplets. In some embodiments for example, and with additional reference to FIG. 4, a print-head apparatus of the present teachings can include a rectangular array of micro-pores, as at 160, with the long dimension, $D_L$, of the array being greater than the diameter, $d_1$, of the droplets 305 deposited on the array, but the short dimension, $D_S$, of the array being less than the diameter, $d_1$, of the droplets 305. Such a configuration can be beneficial, for example, because the micro-pores draw in the liquid ink (as by capillary action), and very uniform filling can be effected by depositing a line of said droplets that completely covers the array as well as a region around (e.g., circumscribing) the array. Thus, the present teachings include configurations and/or applications in which the droplet diameter is larger than at least one linear dimension of the array; but not necessarily every linear dimension of it.

Figure 5:
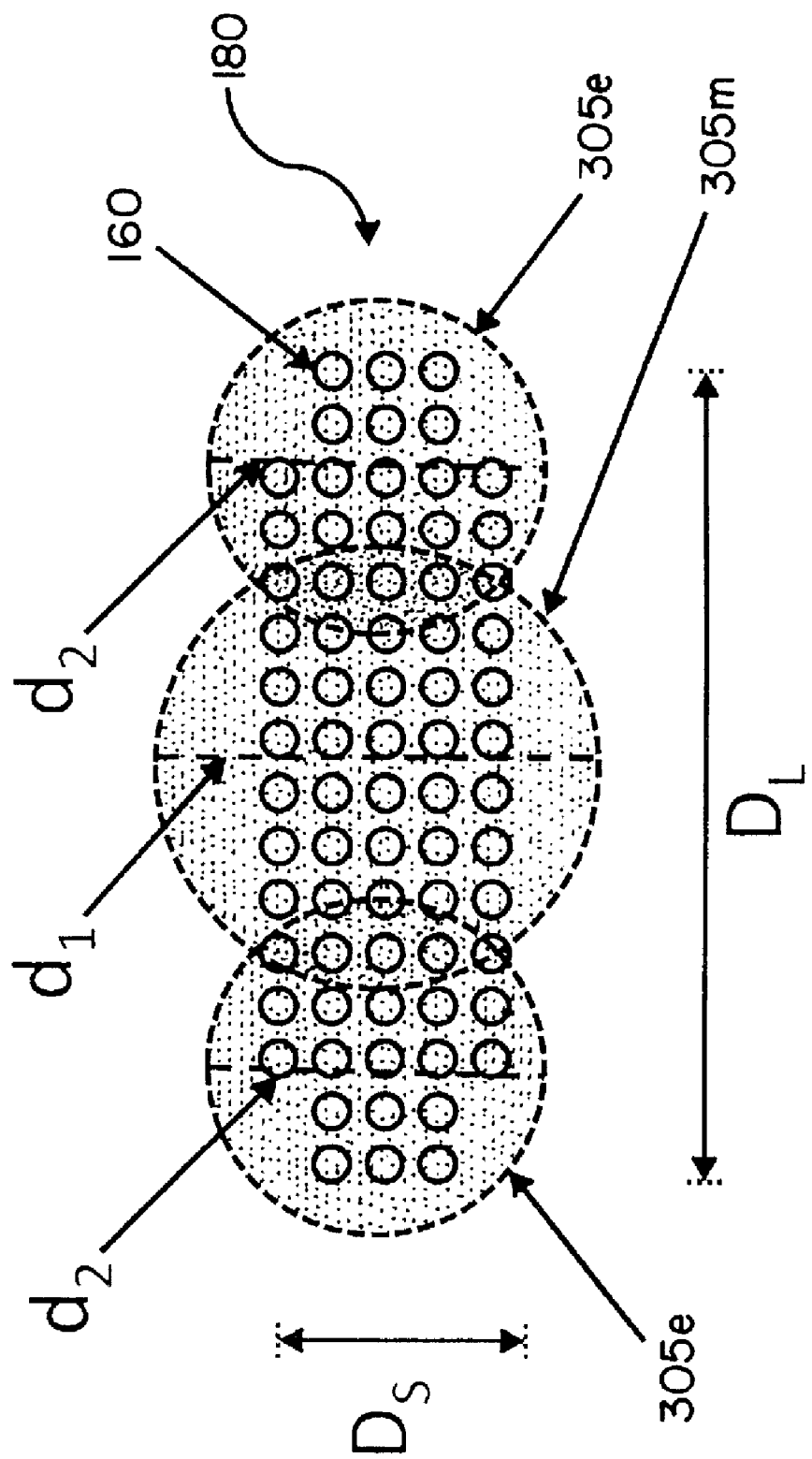
FIG. 5 is a top view schematically depicting a triplet of liquid ink droplets spread over inlets of an array of micro-pores after impact, with the droplets being varied in size, according to various embodiments of the present teachings.

Various embodiments of the present teachings contemplate the use of droplets of different sizes, ejected from an inkjet, as a way to facilitate efficient filling of a given micro-pore array area. Referring now to FIG. 5, with some array configurations of micro-pores, such as the array defined by micro-pores 160, it is preferred to employ an inkjet configured to eject droplets of more than one size (e.g., one orifice may eject droplets of a first size, and two orifices may eject droplets of a second size; with the second size being smaller than the first size). In FIG. 5, for example, three droplets are deposited at respective locations substantially along a line onto the array of micro-pores 160 of discharge nozzle 180, with the two outer or endmost droplets, denoted as 305$e$, having a diameter, $d_2$, which is smaller than the diameter, $d_1$, of a middle or center droplet, denoted as 305$m$.

Aspects of the present teachings, as exemplified by embodiments described herein, facilitate efficient and effective wetting of the inlets of a target array of micro-pores of a discharge nozzle and, consequently, placement of liquid ink in the micro-pores. According to various embodiments, at least fifty percent, at least sixty percent, at least seventy percent, at least eighty percent, at least ninety percent, and/or substantially all of the micro-pores of a target array receive liquid ink.

In various embodiments, a discharge apparatus according to the present disclosure can be used to deposit one or more materials, such as ink, in substantially solid form on one or more substrates. In various embodiments wherein ink is deposited, the ink can be composed, for example, of the material to be deposited on the substrate in the form of particles initially suspended or dissolved in a carrier liquid. The carrier liquid can be, for example, organic, such as acetone, chloroform, isopropanol, chlorbenzene, and toluene, or can be aqueous, such as water. The carrier liquid can also be a mixture of the materials identified above. One or more of the components to be deposited on the substrate can be an organic molecular compound, for example, pentacene, aluminum tris-(8-hydroxyquinoline) (AlQ3), N,N'-diphenyl-N,N'-bis (3-methylphenyl)-(1,1'-biphenyl)-4,4'-diamine (TPD), bathocuproine (BCP), or fac tris(2-phenylpyridine) iridium (Irppy). One or more of the materials to be deposited on the substrate may also be polymeric. One or more of the materials to be deposited on the substrate may be inorganic, such as a semiconductor or insulator or conductor. One or more of the deposited materials can be an electron injection material. One or more of the deposited materials can be an electron transport material. One or more of the deposited materials can be light emitting material. One or more of the deposited materials can be a hole transport material. One or more of the deposited materials can be a hole injecting material. One or more of the deposited materials can be an exciton blocking material. One or more of the deposited materials can be a light absorbing material. One or more of the deposited materials can be a chemical sensing material. The deposited materials may be used as, for instance, conductors, light emitters, light absorbers, charge blockers, exciton blockers, and insulators, in, for instance, OLEDs, transistors, photodetectors, solar cells, and chemical sensors.

The properties of an ink can define an important factor in depositing a film. One of the important performance criteria for the ink can be the efficient, reliable, and uniform loading of the ink material from the chamber into the discharge nozzles. Relevant performance criteria include the ability of the ink: (1) to wet one or more of the discharge nozzle surfaces; (2) to be drawn rapidly into the discharge nozzle holes; and (3) to spread rapidly over the area of the discharge nozzle containing the discharge nozzle holes. Another important performance criterion for the ink is the consistent delivery of the desired mass of material into the discharge nozzle, so the desired amount of material is consistently deposited each time the discharge nozzle discharges its material. The ink can be adapted so that the ink is reliably delivered from the chamber orifice to the discharge nozzle with a consistent ink volume. These adaptations can be implemented for target inks by designing the physical and chemical properties of the ink liquids and the material dissolved or suspended in the ink. These properties include, but are not limited to, viscosity, thixotropy, boiling point, material solubility, surface energy, and vapor pressure.

In one embodiment, the discharge apparatus according to the disclosed embodiments can be used to deposit metal material on a substrate. The deposited metal material can be deposited in substantially solid form. The deposited material can include metal formed utilizing organo-metallic precursor materials dissolved or suspended in a solvent, or metal dissolved or suspended in a solvent. The metal dissolved or suspended in a solvent may comprise, at least partially, nanoparticles, which can be coated with organic compounds. The metal can be, for instance, gold, silver, aluminum, magnesium, or copper. The metal can be an alloy or mixture of multiple metals. Such metal material is useful in many applications, for instance, as thin film electrodes, electrical interconnections between electronic circuit elements, and passive absorptive or reflective patterns. Metal films deposited by the discharge apparatus can be used to deposit the electrodes and electrical interconnections utilized in circuits including organic electronic devices such as OLEDs, transistors, photodetectors, solar cells, and chemical sensors. Organo-metallic or metallic material can be delivered to the discharge nozzle, and upon activation of the discharge nozzle can be delivered to the substrate. A reaction converting the organo-metallic material into metallic material can be carried out prior to, and/or occur during, delivery of the liquid from the chamber to the discharge nozzle, during delivery from the discharge nozzle to the substrate, or following deposition on the substrate. When delivering metal material from the discharge nozzle to the substrate, it can be advantageous, according to various embodiments, to utilize nanoparticles because this can reduce the energy required to dislodge the metal from the micro-pores. Metal deposited on a substrate utilizing the discharge apparatus has the advantage of efficiently utilizing material and employing a deposition technique that may not damage the material onto which the metal film is deposited, including both the underlying substrate and any other deposited layers.

In another embodiment, the discharge apparatus is used to deposit inorganic semiconductor or insulator material in substantially solid form on a substrate. The deposition material can include synthesis utilizing organic and inorganic precursor materials dissolved or suspended in a carrier liquid, or inorganic semiconductor or insulator dissolved or suspended in a carrier liquid. The inorganic semiconductor or insulator dissolved or suspended in a liquid may be comprised (all, or in part) of nanoparticles, which can be coated with organic compounds. The inorganic semiconductor or insulator can be, for instance, group IV semiconductors (for instance, Carbon, Silicon, Germanium), group III-V compound semiconductors (for instance, Gallium Nitride, Indium Phosphide, Gallium Arsenide), II-VI compound semiconductors (for instance, Cadmium Selenide, Zinc Selenide, Cadmium Sulfide, Mercury Telluride), inorganic oxides (for instance, Indium Tin Oxide, Aluminum Oxide, Titanium Oxide, Silicon Oxide), and other chalcogenides. The inorganic semiconductor or insulator can be an alloy or mixture of multiple inorganic compounds. The semiconductor or insulator material can be useful in many applications, for instance, as transparent conductors for electrodes and electrical interconnections between electronic circuit elements, insulating and passivation layers, and as active layers in electronic and optoelectronic devices. When integrated together, these layers can be utilized in circuits containing organic electronic devices such as OLEDs, transistors, photodetectors, solar cells, and chemical sensors.

In another embodiment, precursor or inorganic semiconductor or insulator material can be delivered to the discharge nozzle, and upon activation of the discharge nozzle can be delivered to the substrate. A reaction converting the precursor material into the desired inorganic semiconductor or insulator material can be carried out prior to and/or during delivery of the liquid from the chamber to the discharge nozzle, during delivery from the discharge nozzle to the substrate, or following deposition on the substrate. When delivering inorganic semiconductor or insulator material from the discharge nozzle to the substrate, it can be advantageous to utilize, according to various embodiments, nanoparticles for reducing the energy required to dislodge the material from the micro-pores. Inorganic semiconductor or insulator material deposited on a substrate utilizing the discharge apparatus can have the advantage of efficiently utilizing material and employing a deposition technique that may not damage the material onto which the film is deposited, including both the underlying substrate and any other deposited layers.

While the principles of the present teachings have been illustrated in relation to various exemplary embodiments shown and described herein, the principles of the present teachings are not limited thereto and include any modifications, alternatives, variations and/or equivalents thereof.

It is claimed:

1. An apparatus for a depositing an ink material on a substrates, the apparatus comprising:
   a chamber for receiving liquid ink, the liquid ink having solid ink particles suspended or dissolved in a carrier liquid;
   a discharge nozzle disposed in spaced relation to said chamber and including a plurality of micro-pores, with each micro-pore including a first end region defining an inlet port confronting said chamber, and a second end region defining an outlet port; and
   a plurality of orifices in fluid communication with said chamber, said orifices metering droplets of ink from the chamber along separate respective delivery paths to a respective ones of spaced-apart locations on the inlet ports of the discharge nozzle;
   an activator for pulsatingly dispensing ink from the chamber through the orifices onto the discharge nozzle; and
   a heater in communication with the discharge nozzle for evaporating the carrier liquid and depositing substantially solid particles on the substrate.

2. The apparatus of claim 1, wherein said activator provides said pulsating energy substantially simultaneously to dispense said respective droplets of ink at substantially the same time.

3. The apparatus of claim 1, wherein said plurality of orifices further comprises first, second, and third orifices.

4. The apparatus of claim 3, wherein (i) said inlet ports of said plurality of micro-pores defines a substantially rectangular array including a long axis and a short axis, and (ii) said first, second, and third orifices define a line, with said line disposed substantially parallel to said long axis; and further wherein the diameter of at least one of the metered droplets is smaller than at least one of said axes.

5. The apparatus of claim 3, wherein (i) said inlet ports of said plurality of micro-pores defines a substantially planar array having a non-rectangular shape, and (ii) respective line segments defined by (a) said first and second orifices, and (b) said second and third orifices, together, define a shape substantially similar to said non-rectangular shape; and further wherein said non-rectangular shape has at least one dimension along its plane that is larger than the diameter of at least one of the metered droplets.

6. The apparatus of claim 5, wherein (i) said substantially planar array has a chevron shape, and (ii) respective line segments defined by (a) said first and second orifices, and (b) said second and said third orifices, together, define a chevron shape.

7. The apparatus of claim 1, wherein at least one of said orifices is configured to eject droplets of a first size and at least one other of said orifices is configured to eject droplets of a second size; with said first size being larger than said second size.

8. A method for depositing an ink material on a substrate, the method comprising:
   providing liquid ink to a chamber, the liquid ink having a plurality of particles dissolved or suspended in a carrier liquid;
   energizing two spaced-apart orifices to meter a droplet of ink from each orifice;
   directing the metered droplets of ink along separate delivery paths to respective spaced-apart locations on a discharge nozzle, the discharge nozzle having a plurality of micro-pores for directing droplets of ink;
   heating the ink at the plurality of micro-pores to evaporate the carrier liquid, thereby rendering said plurality of particles substantially free of carrier liquid; and
   discharging the plurality of particles from the micro-pores onto the substrate; whereby the plurality of particles are deposited on the substrate in substantially solid form.

9. The method of claim 8, wherein at least one of said orifices ejects droplets of a first size and another of said orifices ejects droplets of a second size.

10. The method of claim 8, wherein the energizing step further comprises pulsatingly energizing each of a first, a second, and a third spaced-apart orifices to substantially simultaneously meter triplets of droplets.

11. The method of claim 8, further comprising receiving each of the metered droplets at a respective one of a plurality of micropores inlets.

12. The method of claim 11, wherein a defined number of said plurality of inlets are regularly spaced forming a substantially planar array, with the array having at least one dimension along its plane that is larger than the diameter of one of the metered droplets; and wherein said metered droplets are deposited at respective, spaced-apart locations along said array such that said step of transporting the metered droplets through the inlets results in at least fifty percent of the micro-pores corresponding to said defined number of inlets receiving micro-volumes of liquid ink.

13. The method of claim 12, wherein in at least eighty percent of the micro-pores corresponding to said defined number of inlets receive micro-volumes of liquid ink.

14. The method of claim 8, further comprising pulsatingly energizing the first, the second, and the third spaced-apart orifices.

15. The method of claim 14, wherein (i) said plurality of micro-pores defines rectangular array including a long axis and a short axis, and (ii) said first, second, and third orifices define a line, with said line disposed substantially parallel to said long axis; and further wherein the diameter of at least one of the metered droplets is smaller than at least one of said axes.

16. The method of claim 14, wherein (i) said plurality of micro-pores defines an array having a non-rectangular shape, and (ii) respective line segments defined by (a) said first and second orifices, and (b) said second and said third orifices, together, define a shape substantially similar to said non-rectangular shape; and further wherein the array has a surface area that is larger across at least one dimension, generally orthogonal to said delivery paths, than the diameter of one of the metered droplets.

17. A method for depositing one or more materials on one or more substrates, the method comprising:
    retaining a volume of liquid ink in a holding region, said liquid ink comprising a plurality of particles dissolved or suspended in a carrier liquid;
    delivering energy to said holding region, thereby substantially simultaneously ejecting a plurality of droplets of liquid ink from at least two spaced-apart locations along said holding region such that each droplet is passed along a respective delivery path to a unique location along a plane adjacent said holding region;
    subdividing each of the ejected droplets into a plurality of micro-volumes of liquid ink, each micro-volume disposed in a respective micro-holding region immediately adjacent said plane;
    heating the micro-holding regions to a first temperature such that the carrier liquid evaporates, thereby providing solid particles in the micro-holding regions that are substantially free of carrier liquid;
    further heating the micro-holding regions to a second temperature such that the solid particles therein are vaporized into a gas; and
    directing the gas out of the micro-holding regions and onto a substrate adjacent thereto, upon which it solidifies.

18. The method of claim 17, wherein, upon delivering energy to said holding region, three droplets of liquid ink are substantially simultaneously ejected therefrom and then substantially simultaneously passed along respective delivery paths to three unique locations along said plane.

19. The method of claim 18, wherein a defined number of regularly-spaced micro-holding regions define an array, wherein said three droplets are deposited at respective, spaced-apart locations along said array such that said step of subdividing results in at least eighty percent of said defined number of micro-holding regions of the array receiving micro-volumes of liquid ink; and further wherein the array defines a substantially planar surface area that is larger across at least one dimension, generally orthogonal to said delivery paths, than the diameter of one of the ejected droplets.

20. The method of claim 19, wherein said substantially planar surface area is smaller across at least a second dimension, generally orthogonal to said delivery paths, than the diameter of one of the ejected droplets.

21. The method of claim 17, wherein droplets ejected from one of said at least two spaced-apart locations are a first size, and droplets ejected from another of said at least two spaced-apart locations are a second size; with said first size being larger than said second size.

22. The method of claim 18, wherein at least one of said at least two spaced-apart locations is a first orifice in fluid communication with a first chamber and at least one other of said at least two spaced-apart locations is a second orifice in fluid communication with a second chamber.

* * * * *